(12) United States Patent
Montgomery et al.

(10) Patent No.: US 6,421,180 B1
(45) Date of Patent: Jul. 16, 2002

(54) APPARATUS FOR GENERATING A LASER PATTERN ON A PHOTOMASK AND ASSOCIATED METHODS

(75) Inventors: Robert Morris Montgomery, Indialantic; Lee Martin Burberry, West Melbourne, both of FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/533,447

(22) Filed: Mar. 23, 2000

(51) Int. Cl.[7] ................ G02B 27/10; G02B 27/14; G02B 5/32; H01J 3/14; B41J 2/47
(52) U.S. Cl. ............. 359/618; 359/629; 359/17; 359/19; 250/237; 347/239
(58) Field of Search ............... 359/618, 17, 19, 359/196, 305, 204, 212, 216, 629, 217; 347/239, 255; 250/237

(56) References Cited

U.S. PATENT DOCUMENTS

| 4,541,712 | A | | 9/1985 | Whitney ................ 355/53 |
| 4,997,261 | A | | 3/1991 | Taniura |
| 5,155,628 | A | | 10/1992 | Dossmann ............ 359/640 |
| 5,386,221 | A | * | 1/1995 | Allen ..................... 347/249 |
| 5,861,991 | A | | 1/1999 | Fork ...................... 359/618 |
| 5,870,227 | A | | 2/1999 | Rope et al. ............ 359/618 |
| 6,133,576 | A | * | 10/2000 | Shafer et al. ......... 252/458.1 |

* cited by examiner

Primary Examiner—Loha Ben
Assistant Examiner—Michael A. Lucas
(74) Attorney, Agent, or Firm—Allen, Dyer, Doppelt, Milbrath & Gilchrist, P.A.

(57) ABSTRACT

An apparatus for generating a pattern on a photomask includes a beam generator generating a row of spaced apart optical beams, a blocking element downstream from the beam generator in a path of at least one of the optical beams, and a refracting element downstream from the blocking element for aligning optical beams closer together and while leaving an enlarged beam spacing downstream from the at least one blocked optical beam. The apparatus further includes a modulator downstream from the refracting element for defining the pattern to be generated on the photomask. The apparatus generates the row of spaced apart optical beams with an enlarged beam spacing between the two central beams without using high precision mirrors that are expensive to produce and requires precise alignment with respect to one another.

47 Claims, 3 Drawing Sheets

APPARATUS FOR GENERATING A LASER PATTERN ON A PHOTOMASK AND ASSOCIATED METHODS

FIELD OF THE INVENTION

The present invention relates to the field of semiconductor processing, and, more particularly, to an apparatus and method for generating a pattern on a photomask.

BACKGROUND OF THE INVENTION

In the photolithographic fabrication of integrated circuits, a film sensitive to optical beams is exposed in predetermined patterns to define circuit features. Optical beams are passed through masks which contain the patterns, thereby selectively exposing the photosensitive film on a semiconductor body. In other instances, the photosensitive film is on a mask substrate and the film is exposed as a step in the making of the photomask.

A system for making a photomask is disclosed in U.S. Pat. No. 5,386,221 to Allen et al. A laser beam is used to expose a photosensitive film for defining a pattern on a photomask. A beam splitter splits the laser beam into 32 individual optical beams to create what is commonly referred to as a brush. The beam splitter is also referred to as a brush module. Increased print speed is accomplished through the use of a wider brush. A scanner scans the 32 optical beams across the photosensitive material. The optical beams are modulated by an acoustic-optical modulator (AOM) to define the pattern to be generated on the photomask.

The beam splitter disclosed in Allen et al. produces 32 optical beams which are evenly spaced apart except for the two central beams which have a different spacing referred to as a diastemal split. The diastemal split plays a role in generating the proper error averaging during successive passes of the optical beams in the printing process.

To produce the 32 optical beams, 5 spaced apart high precision mirrors are used. Initially, a single optical beam enters a first splitter of thickness t which splits the optical beam into 2 optical beams. The splitter has a first surface which reflects 50% of the optical beam, a transparent material, and a second surface which reflects the remaining 50% of the optical beam. The distance between the two optical beams is determined by the distance between the first and second surfaces, i.e., the thickness of the transparent material.

The two optical beams are reflected from a second splitter of thickness 2t. The second splitter creates 4 beams. The 4 beams are reflected from a splitter of thickness 4t which creates 8 beams. These 8 beams are reflected from another splitter of thickness 8t which creates 16 beams. The remaining 16 beams are reflected from a fifth splitter having a thickness of 16.5t to create the desired 32 beams. The fifth splitter is thicker than twice the thickness of the fourth splitter. This creates the disatemal split between the two centermost optical beams. A disadvantage of this approach is that these mirrors are expensive to produce and require precise alignment with respect to one another.

SUMMARY OF THE INVENTION

In view of the foregoing background, it is therefore an object of the present invention to generate a plurality of spaced apart optical beams with a different or enlarged beam spacing between two of the optical beams without using a series of high precision mirrors.

This and other objects, features and advantages in accordance with the present invention are provided by an apparatus for generating a pattern on a photomask comprising a beam generator generating a row of spaced apart optical beams, a blocking element downstream from the beam generator in a path of at least one of the optical beams, and a refracting element downstream from the blocking element for aligning optical beams therefrom closer together and while leaving an enlarged beam spacing downstream from the at least one blocked optical beam The apparatus preferably further comprises a modulator downstream from the refracting element for defining the pattern to be generated on the photomask, and a scanner for causing the optical beams to scan across the photomask.

The beam generator preferably comprises a laser generating an optical beam, a diffractive optical device downstream from the laser and generating a plurality of optical beams, and a collimator downstream from the diffractive optical device for collimating the plurality of optical beams into the row of spaced apart optical beams. In one embodiment, the optical beams preferably have a substantially equal beam spacing. The blocking element preferably blocks a center optical beam, and the enlarged beam spacing downstream from the blocking element is preferably greater than about one times and less than about two times the substantially equal beam spacing., The optical beams from the beam generator may be 33 in number, and the blocking element may block the center one of the 33 optical beams. The apparatus according to the present invention advantageously generates the row of spaced apart optical beams with the enlarged beam spacing between the two remaining central beams without using a series of high precision mirrors that are expensive to produce and require precise alignment with respect to one another.

The refracting element preferably comprises silica. In one embodiment, the refracting element preferably comprises a pair of angled refracting portions defining an apex aligned with the blocking element. The beam generator preferably generates the optical beams so that each has a wavelength within a range of about 190 to 400 nm.

Another aspect of the invention relates to a method for generating a pattern on a photomask. The method preferably comprises generating a plurality of optical beams, blocking at least one of the optical beams, and aligning the unblocked optical beams closer together and defining an enlarged beam spacing downstream from the at least one blocked optical beam. The method preferably further comprises modulating the aligned optical beams for defining the pattern to be generated on the photomask, and scanning the modulated optical beams across the photomask.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
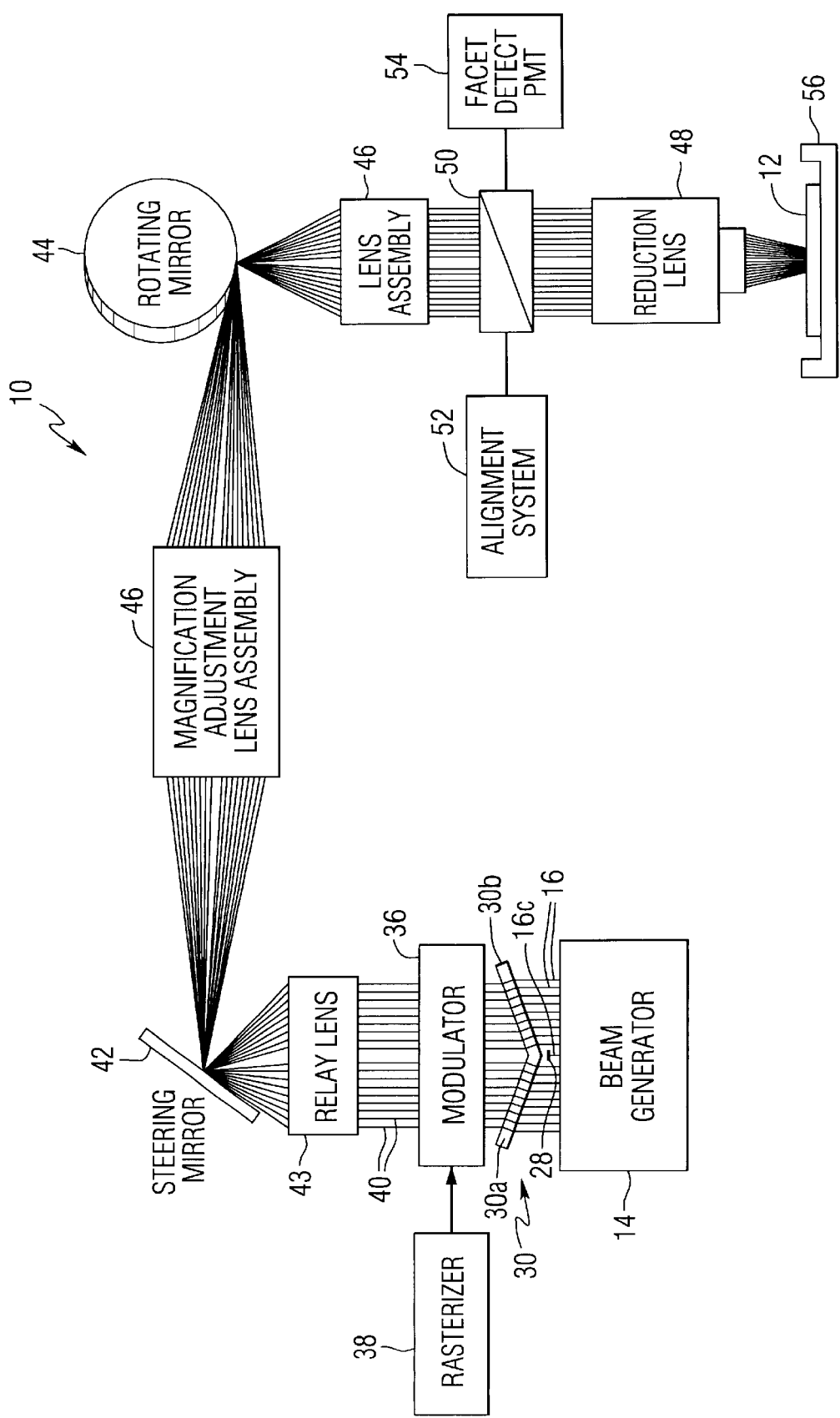
FIG. 1 is a block diagram of an apparatus for generating a pattern on a photomask in accordance with the present invention.

A pattern generation apparatus 10 for generating a pattern on a photomask 12 in accordance with the present invention is initially described with reference to FIGS. 1 and 2. A beam generator 14 generates a row of spaced apart optical beams 16. The spaced apart optical beams 16 preferably have a substantially equal beam spacing. The present invention is also applicable to beam spacings that are not substantially equal as will be readily appreciated by one skilled in the art.

Figure 2:
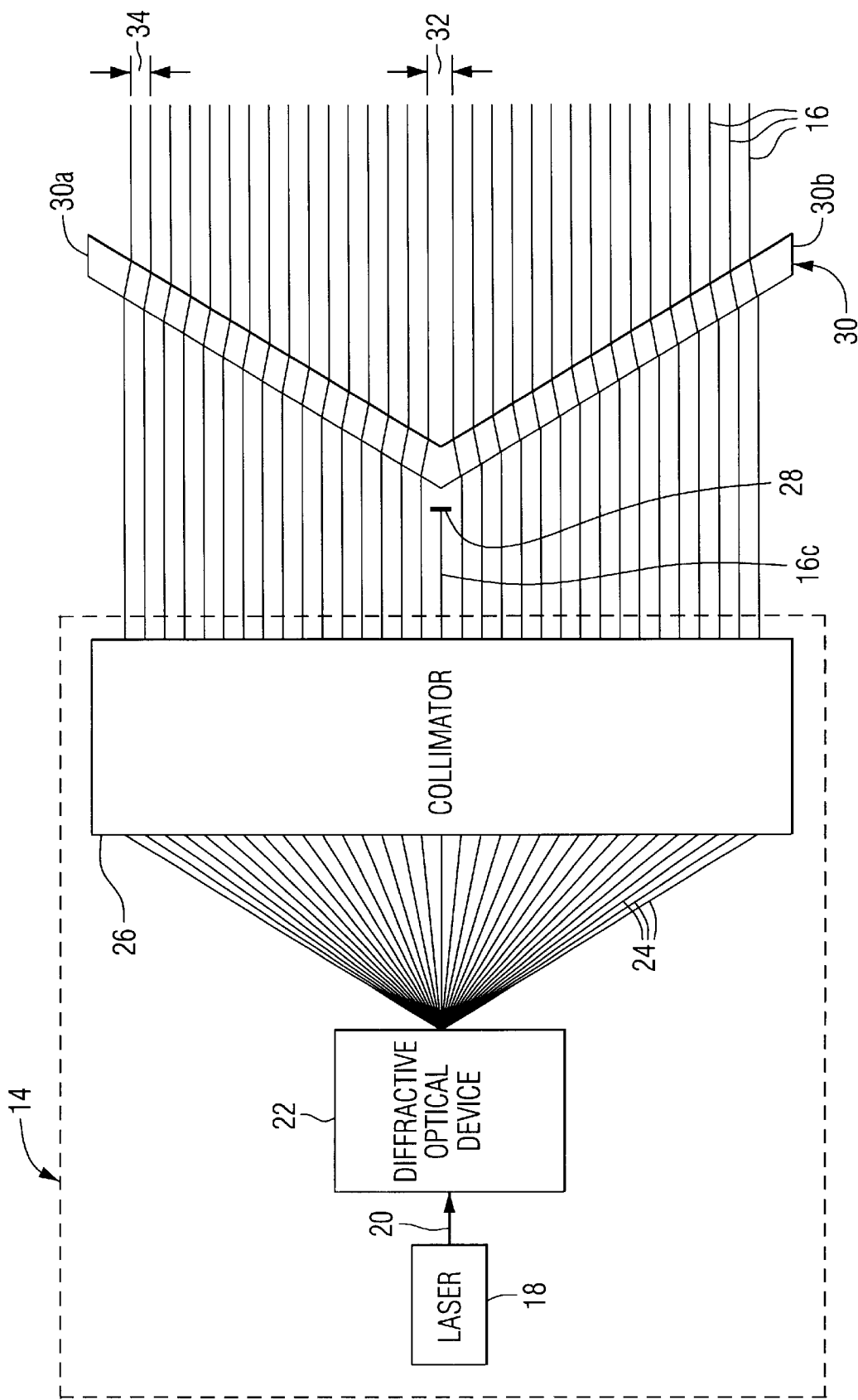
FIG. 2 is a block diagram of the beam generator and a portion of the downstream components in accordance with the present invention.

As best shown in FIG. 2, the beam generator 14 includes a laser 18 generating an optical beam 20, a diffractive optical device 22 downstream from the laser and generating a plurality of input optical beams 24, and a collimator 26 downstream from the diffractive optical device. In the illustrated embodiment, the beam generator 14 generates each of the plurality of spaced apart optical beams 16 to have a wavelength within a range of about 190 to 400 nm. This wavelength corresponds to deep UV light and UV light. However, other sources of the optical beams 20 can be utilized, such as visible light, coherent light, x-rays and electron beams as will be readily appreciated by one skilled in the art.

A blocking element 28 is downstream from the beam generator 14 in a path of at least one of the optical beams. The blocking element 28 preferably blocks a center optical beam 16c. However, optical beams other than the center optical beam 16c can be blocked if necessary, as will be readily appreciated by one skilled in the art. In the illustrated embodiment, the plurality of optical beams 16 from the beam generator 14 is 33 in number, and the blocking element 28 blocks the central optical beam. The plurality of optical beams 16 are commonly referred to as a brush, and a larger number of output optical beams, such as 32, allows the photomask 12 to be patterned more quickly. As will be readily appreciated by those skilled in the art, the number of optical beams can vary depending on the intended application.

A refracting element 30 is downstream from the blocking element 28 for aligning optical beams closer together and while leaving an enlarged beam spacing 32 downstream from the at least one blocked optical beam 16c. The enlarged beam spacing 32 is greater than about one times and less than about two times the substantially equal beam spacing of the aligned optical beams 16. This spacing is also referred to as the diastemal split. The diastemal split plays a role in generating the proper error averaging during successive passes of the optical beams in the printing process as will be appreciated by those skilled in the art.

A modulator 36 is downstream from the refracting element 30 for defining the pattern to be generated on the photomask 12. The modulator 36, for example, can be a 32 channel Acoustic-Optical Modulator (AOM). The electrical signals coupled to these channels determine the specific patterns to be generated on the photomask 12. These electrical signals are created by a rasterizer 38, which is connected to the modulator 36 for providing the electrical signals thereto.

The modulated optical beams 40 are illustratively directed to a steering mirror 42 via a relay lens 43. The steering mirror 42 provides small corrections to the placement of the modulated optical beams 40 on the photosensitive material carried by the photomask 12 being patterned. The steering mirror 42 alters the angle at which the modulated optical beams 40 impinge on a scanner, which typically includes a rotating mirror 44.

Prior to reaching the rotating mirror 44, the modulated optical beams 40 pass through a magnification adjustment lens assembly 46. The magnification adjustment lens assembly 46 is used to adjust the size of the modulated optical beams 40. In particular, the beams can be made larger and moved farther apart, or they may be made smaller and moved closer together. The optical beams are then directed onto facets of the rotating mirror 44. The facets on the rotating mirror 44 cause the modulated optical beams 40 to scan the photomask 12 along a scan axis. The rotating mirror 44 typically rotates at a constant rate, such as 20 krpm, for example.

The modulated optical beams 40 reflected from the rotating mirror 44 pass through a lens assembly 46 for creating an enlarged intermediate image plane. At the other end of the enlarged intermediate image plane is a reduction lens 48. The modulated optical beams 40 exiting the reduction lens 48 are the beams that scan the photosensitive material carried by the photomask 12.

A beam splitter 50 is positioned within the enlarged intermediate image plane. The beam splitter 50 directs beams to an alignment system 52 and a facet detect Photo-Multipler Tube (PMT) 54. The facet detect PMT 54 is used for timing data for each of the facets of the rotating mirror 44. This allows synchronization of the information from the rasterizer 38 to the modulator 36, and the rotation of the rotating mirror 44. The alignment system 52 is used to detect the position of the patterns previously written on the photosensitive film so that the next pattern to be written can be accurately aligned to the previously written pattern.

The holder 56 carrying the photomask 12 is typically mounted on a stage assembly, not shown, as will be appreciated by those skilled in the art. The stage assembly moves the photomask 12, and is monitored by a plurality of interferometers, and stage motion is performed by linear motors. Such stage assemblies are readily known by one skilled in the art, and need not be described in further detail.

The beam generator 14, the blocking element 28 and the refracting element 30 will now be described in greater detail. The laser 18 may be a doubled Argon laser generating the initial optical beam 20 at a wavelength of 257.25 nm. The optical beam 20 generated by the laser 18 may have a Gaussian profile. A diameter of the optical beam may be equal to or less than about 4 mm, with a typical diameter being 1 mm at an intensity of $1/e^2$.

The blocking element 28 is in the path of the center optical beam 16c so that the number of unblocked optical beams is equal to 32. When the input beam diameter d is equal to 1 mm, the input angular spread θ between the plurality of optical beams 24 is equal to 4γ/nd. This corresponds to an angular spacing of 3.976θ between beams. In other words, the spacing 34 between the output beams 16 is 3.976 times the angular spread of a single beam. The enlarged beam spacing 32 resulting from the blocking element 28 is greater than about one times and less than about two times the angular spacing of 3.976θ between beams, and preferably, the enlarged beam spacing is 1.5 times the angular spacing between adjacent beams, i.e., 5.964θ.

The beam quality of the unblocked output beams may correspond to an rms wavefront error of less than 1/10γ when measured over the beam area out to the 1/20 intensity radius. The least intense of the 32 beams may be greater than 80% of the power of a single beam from an ideal, 100% efficient 32 channel splitter. In other words, the least intense beam may be greater than 0.8Pin/32, where Pin is the input beam power. The difference in power between the least intense and the most intense beam may be no more than 10% of the average of these two beams.

The diffractive optical device 22, as readily understood by one skilled in the art, includes a series of lenses for generating the plurality of input optical beams 24. For example, with the optical beams 16 having a wavelength of 257.25 nm, a first lens close to a diffractive optical element within the diffractive optical device 22 may be a 200 mm lens in the path of the 33 beams. The width of the angular fan of the 33 beams may be 2.5 mm. A second lens, which may be a −40 mm lens, is separated by about 6.5 inches from the first lens. A third lens, which may be a 150 mm lens, is separated from the second lens by about 4.5 inches. The actual size and spacing of the lenses will vary depending upon the characteristics of the input optical beam as will be readily appreciated by those skilled in the art.

A conventional optical beam splitter producing the same 32 parallel optical beams with the same enlarged beam spacing requires 5 spaced apart, high precision mirrors. Each mirror doubles the received number of optical beams. The final mirror receives 16 optical beams and splits them into 32 optical beams with the required spacing between the two central optical beams. A disadvantage of this approach is that these mirrors are expensive to produce and require precise alignment with respect to each other.

The collimator 26 collimates or straightens the plurality of input optical beams 24 so that they are substantially equally spaced apart. The refracting element 30 comprises silica or fused silica. More particularly, the refracting element 30 includes a pair of angled refracting portions 30a, 30b defining an apex aligned with the blocking element 28. The refracting portions 30a, 30b can be tilted so that the diffraction grating can be varied for adjusting the enlarged beam spacing 32 without effecting focus or beam shape of the optical beams 16. More specifically, when the refracting portions 30b, 30b have a thickness of 1 mm, the refracting portions are tilted at an angle of about 17 degrees with respect to the wavefront of the optical beams.

Figure 3:
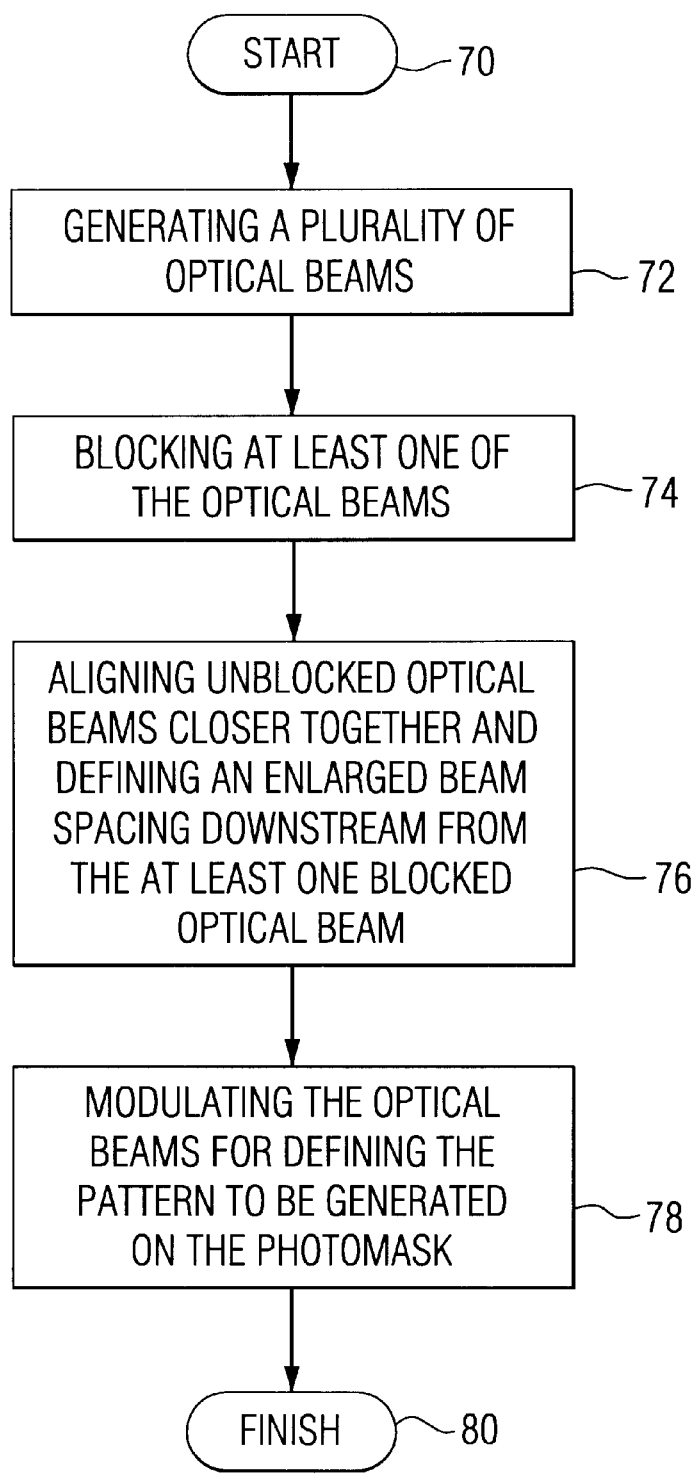
FIG. 3 is a flowchart illustrating a method for generating the pattern on the photomask in accordance with the present invention.

Another aspect of the invention relates to a method for generating a pattern on a photomask 12 as best shown in FIG. 3. From the start (Block 70), the method comprises generating a plurality of spaced apart optical beams 16 at Block 72, blocking at least one of the optical beams 16c and aligning unblocked optical beams closer together and defining an enlarged beam spacing 32 downstream from the at least one blocked optical beam at Block 74. The method further comprises modulating the optical beams at Block 78 for defining the pattern to be generated on the photomask 12, and scanning the modulated optical beams across the photomask. The method is finished at Block 80.

The step of generating the plurality of optical beams 16 preferably comprises passing an optical beam through a diffractive optical device 22 to generate the plurality of optical beams 24, and collimating the plurality of optical beams from the diffractive optical device 22 to be substantially equally spaced apart.

The step of blocking at least one of the optical beams preferably comprises blocking a center optical beam 16c. The enlarged beam spacing 32 downstream from the at least one blocked optical beam 16c is preferably greater than one times and less than two times a spacing 34 between the substantially equally spaced apart optical beams. A number of unblocked optical beams may be 32.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An apparatus for generating a pattern on a photomask comprising:
   a beam generator generating a row of spaced apart optical beams;
   a blocking element downstream from said beam generator in a path of at least one of the optical beams;
   a refracting element downstream from said blocking element for aligning optical beams therefrom closer together and while leaving an enlarged beam spacing downstream from the at least one blocked optical beam; and
   a modulator downstream from said refracting element for defining the pattern to be generated on the photomask.

2. An apparatus according to claim 1 wherein said blocking element blocks a center optical beam.

3. An apparatus according to claim 1 wherein said beam generator generates the optical beams to have a substantially equal beam spacing.

4. An apparatus according to claim 3 wherein the enlarged beam spacing is greater than about one times and less than about two times the substantially equal beam spacing.

5. An apparatus according to claim 1 further comprising a scanner causing the optical beams to scan across the photomask.

6. An apparatus according to claim 5 wherein said scanner comprises a rotating mirror.

7. An apparatus according to claim 1 wherein said beam generator comprises:
   a laser generating an optical beam;
   a diffractive optical device downstream from said laser and generating a plurality of optical beams; and
   a collimator downstream from said diffractive optical device for collimating the plurality of optical beams into the row of spaced apart optical beams.

8. An apparatus according to claim 1 wherein a number of optical beams from said beam generator is 33, and wherein said blocking element blocks one of the 33 optical beams.

9. An apparatus according to claim 1 wherein said refracting element comprises silica.

10. An apparatus according to claim 1 wherein said beam generator generates each optical beam to have a wavelength within a range of about 190 to 400 nm.

11. An apparatus according to claim 1 further comprising a holder for the photomask positioned downstream from said modulator.

12. An apparatus for generating a pattern on a photomask comprising:
   a beam generator generating a row of substantially equally spaced apart optical beams;
   a blocking element downstream from said beam generator in a path of a center optical beam;
   a refracting element downstream from said blocking element for aligning optical beams therefrom closer together and while leaving an enlarged beam spacing downstream from the blocked center optical beam; and a modulator downstream from said refracting element for defining the pattern to be generated on the photomask.

13. An apparatus according to claim 12 wherein the enlarged beam spacing is greater than about one times and less than about two times the substantially equal beam spacing.

14. An apparatus according to claim 12 further comprising a scanner causing the optical beams to scan across the photomask.

15. An apparatus according to claim 14 wherein said scanner comprises a rotating mirror.

16. An apparatus according to claim 12 wherein said beam generator comprises:

a laser generating an optical beam;

a diffractive optical device downstream from said laser and generating a plurality of optical beams; and a collimator downstream from said diffractive optical device for collimating the plurality of optical beams so that they are substantially equally spaced apart.

17. An apparatus according to claim 12 wherein a number of optical beams from said beam generator is 33.

18. An apparatus according to claim 12 wherein said refracting element comprises silica.

19. An apparatus according to claim 18 wherein said refracting element comprises a pair of angled refracting portions defining an apex aligned with said blocking element.

20. An apparatus according to claim 12 wherein said beam generator generates each optical beam to having a wavelength within a range of about 190 to 400 nm.

21. An apparatus according to claim 12 further comprising a holder for the photomask positioned downstream from said modulator.

22. An optical device comprising:

a diffractive optical device having an input receiving an optical beam and an output providing a plurality of optical beams;

a collimator downstream from said diffractive optical device for collimating the plurality of optical beams;

a blocking element downstream from said collimator in a path of at least one of the optical beams; and a refracting element downstream from said blocking element for aligning optical beams therefrom closer together and while leaving an enlarged beam spacing downstream from the at least one blocked optical beam.

23. An optical device according to claim 22 wherein said blocking element blocks a center optical beam.

24. An optical device according to claim 22 wherein said collimator aligns the optical beams to have a substantially equal beam spacing.

25. An optical device according to claim 24 wherein the enlarged beam spacing is greater than about one times and less than about two times the substantially equal beam spacing.

26. An optical device according to claim 22 wherein a number of optical beams from said diffractive optical device is 33, and wherein said blocking element blocks one of the 33 optical beams.

27. An optical device according to claim 22 wherein said refracting element comprises silica.

28. An optical device according to claim 22 wherein said refracting element comprises a pair of angled refracting portions defining an apex aligned with said blocking element.

29. An optical device according to claim 22 wherein each optical beam has a wavelength within a range of about 190 to 400 nm.

30. A method for generating a pattern on a photomask comprising:

generating a plurality of optical beams;

blocking at least one of the optical beams;

aligning unblocked optical beams closer together and defining an enlarged beam spacing downstream from the at least one blocked optical beam; and modulating the aligned optical beams for defining the pattern to be generated on the photomask.

31. A method according to claim 30 further comprising scanning the modulated optical beams across the photomask.

32. A method according to claim 30 wherein generating the plurality of optical beams comprises:

passing an optical beam through a diffractive optical device to generate a plurality of optical beams; and collimating the plurality of optical beams from the diffractive optical device to be substantially equally spaced apart.

33. A method according to claim 32 wherein the enlarged spacing downstream from the at least one blocked optical beam is greater than one times and less than two times a spacing between the substantially equally spaced apart optical beams.

34. A method according to claim 30 wherein blocking at least one of the optical beams comprises blocking a center optical beam.

35. A method according to claim 30 wherein aligning is performed using a refracting element.

36. A method according to claim 30 wherein the refracting element comprises a pair of angled refracting portions defining an apex aligned with the at least one blocked optical beam.

37. An apparatus for generating a pattern on a photomask comprising:

a beam generator generating a row of spaced apart optical beams;

a blocking element downstream from said beam generator in a path of at least one of the optical beams;

a refracting element downstream from said blocking element for aligning optical beams therefrom closer together and while leaving an enlarged beam spacing downstream from the at least one blocked optical beam, said refracting element comprising a pair of angled refracting portions defining an apex aligned with said blocking element; and a modulator downstream from said refracting element for defining the pattern to be generated on the photomask.

38. An apparatus according to claim 32 wherein said blocking element blocks a center optical beam.

39. An apparatus according to claim 37 wherein said beam generator generates the optical beams to have a substantially equal beam spacing.

40. An apparatus according to claim 39 wherein the enlarged beam spacing is greater than about one times and less than about two times the substantially equal beam spacing.

41. An apparatus according to claim 37 further comprising a scanner causing the optical beams to scan across the photomask.

42. An apparatus according to claim 41 wherein said scanner comprises a rotating mirror.

43. An apparatus according to claim 37 wherein said beam generator comprises:
- a laser generating an optical beam;
- a diffractive optical device downstream from said laser and generating a plurality of optical beams; and
- a collimator downstream from said diffractive optical device for collimating the plurality of optical beams into the row of spaced apart optical beams.

44. An apparatus according to claim 37 wherein a number of optical beams from said beam generator is 33, and wherein said blocking element blocks one of the 33 optical beams.

45. An apparatus according to claim 37 wherein said refracting element comprises silica.

46. An apparatus according to claim 37 wherein said beam generator generates each optical beam to have a wavelength within a range of about 190 to 400 nm.

47. An apparatus according to claim 37 further comprising a holder for the photomask positioned downstream from said modulator.

* * * * *

UNITED STATES PATENT AND TRADEMARK OFFICE
CERTIFICATE OF CORRECTION

PATENT NO. : 6,421,180 B1 Page 1 of 1
DATED : July 16, 2002
INVENTOR(S) : Robert Morris Montgomery and Lee Martin Burberry It is certified that error appears in the above-identified patent and that said Letters Patent is hereby corrected as shown below:

Title page,
Item [56], References Cited, OTHER PUBLICATIONS, insert:
-- KATAOKA ET AL.: "Optics for Modulating Multiple Beams Using an Asymmetric Multilevel Phase Grating and a Multichannel Acousto-optic Modulator" APPLIED OPTICS, Feb. 1, 1997, OPT. SOC. AMERICA, USA, Vol. 36, No. 4, pages 853-861, XP002184780, ISSN: 0740-3224 --

Column 2,
Line 24, delete "spacing.," insert -- spacing. --

Column 4,
Line 57, delete "$4\gamma/nd$." insert -- $4\lambda/\pi d$. --
Line 67, delete "$^1/_{10}\gamma$" insert -- $1/10\lambda$ --

Column 5,
Line 43, delete "30b, 30b" insert -- 30a, 30b --

Column 8,
Line 54, delete "claim 32" insert -- claim 37 --

Signed and Sealed this

Twenty-fourth Day of December, 2002

JAMES E. ROGAN
*Director of the United States Patent and Trademark Office*